United States Patent
Ikegami

(10) Patent No.: US 6,504,240 B2
(45) Date of Patent: Jan. 7, 2003

(54) SEMICONDUCTOR DEVICE HAVING RELIABLE COUPLING BETWEEN WIRING SUBSTRATE AND SEMICONDUCTOR PELLET

(75) Inventor: Gorou Ikegami, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/737,663

(22) Filed: Dec. 15, 2000

(65) Prior Publication Data

US 2001/0004536 A1 Jun. 21, 2001

(30) Foreign Application Priority Data

Dec. 20, 1999 (JP) ............................................. 11-360084

(51) Int. Cl.⁷ ........................... H01L 23/02; H01L 29/40
(52) U.S. Cl. ....................... 257/678; 257/777; 257/785; 257/794
(58) Field of Search ................................. 257/676, 677, 257/678, 760, 773, 777, 778, 782, 785, 793, 794, 686, 702; 29/846; 438/126

(56) References Cited

U.S. PATENT DOCUMENTS

| | | | | |
|---|---|---|---|---|
| 4,998,159 A | * | 3/1991 | Shinohara et al. | .......... 174/255 |
| 5,517,758 A | * | 5/1996 | Nakamura | .................. 174/266 |
| 6,136,733 A | * | 10/2000 | Blumberg et al. | .......... 156/286 |
| 6,228,680 B1 | * | 5/2001 | Thomas | ....................... 438/106 |
| 6,286,207 B1 | * | 9/2001 | Oura et al. | .................... 29/830 |
| 6,303,219 B1 | * | 10/2001 | Sawamura et al. | ......... 428/343 |

FOREIGN PATENT DOCUMENTS

| | | |
|---|---|---|
| JP | 6-204632 | 7/1994 |
| JP | 7-112506 | 5/1995 |

* cited by examiner

Primary Examiner—Wael Fahmy
Assistant Examiner—William David Coleman
(74) Attorney, Agent, or Firm—Choate, Hall & Stewart

(57) ABSTRACT

A semiconductor device comprising a wiring substrate which has a laminated glass fabric body made by laminating a plurality of glass fabrics and impregnating with resin. A resin layer is provided on at least one of surfaces of the laminated glass fabric body. A plurality of pad electrodes are formed on the resin layer. The resin layer has a thickness from 1.5 to 2.5 times the depth of unevenness of the surface of the laminated glass fabric body on which the resin layer exists. A semiconductor pellet is disposed on the wiring substrate and has a plurality of projected electrodes. The projected electrodes are electrically coupled to the pad electrodes by pressing the projected electrodes to the pad electrodes while heating the wiring substrate and/or the semiconductor pellet. Tip portions of the projected electrodes together with the pad electrodes plunge into the resin layer.

11 Claims, 2 Drawing Sheets

PRIOR ART

SEMICONDUCTOR DEVICE HAVING RELIABLE COUPLING BETWEEN WIRING SUBSTRATE AND SEMICONDUCTOR PELLET

FIELD OF THE INVENTION

The present invention relates generally to a semiconductor device having a wiring substrate formed by using glass fabrics impregnated with resin. More particularly, the present invention relates to a semiconductor device in which pad electrodes formed on the wiring substrate and projected electrodes or bump electrodes of a semiconductor pellet are opposed and superposed, and the pad electrodes and the projected electrodes superposed on each other are pressed toward each other and heated to electrically couple the projected electrodes and the pad electrodes.

BACKGROUND OF THE INVENTION

It is desired that portable type electronic circuit devices, such as a note type personal computer, a portable telephone and the like, are compact and lightweight. Therefore, the external size of each electronic component used in the portable type electronic devices is reduced by reducing the sizes of one or more electronic parts used in the electronic component. In other way, each electronic component is substantially downsized by increasing the mounting density of the electronic parts included in the electronic component although the external size of the electronic component is the same as before.

Also, each lead as an electrode for coupling the electronic component and an external circuit is shaped into a surface mountable form and, thereby, projection length of the lead is reduced. Further, each lead is replaced by a projection type electrode such that an external size of the electronic component can be reduced as small as possible. In this way, the electronic components are downsized.

As an example of such electronic components, a semiconductor device having a Chip Size Package (CSP) structure is generally used. In the semiconductor device having the CSP structure, a semiconductor pellet is flip-chip bonded on a wiring substrate and the semiconductor pellet and the wiring substrate are bonded by using resin.

With reference to the drawings, an explanation will be made on a conventional semiconductor device having the CSP structure. FIG. 3 is a side cross sectional view showing a schematic structure of a conventional semiconductor device having the CSP structure. The conventional semiconductor device 110 shown in FIG. 3 comprises a wiring substrate 104, and a semiconductor pellet 101 mounted on the wiring substrate 104. The semiconductor pellet 101 has a semiconductor substrate 102 and many projected electrodes 103 formed on one of the main surfaces of the semiconductor substrate 102. In the semiconductor substrate 102, a number of electronic elements (not shown in the drawing) are formed and wired internally to form circuits.

A wiring substrate 104 comprises an insulating substrate 105, pad electrodes 106 formed on one of the main surfaces of the insulating substrate 105, and electrodes 107 for external connection formed on the other of the main surfaces of the insulating substrate 105. The pad electrodes 106 are formed at locations corresponding to those of the projected electrodes 103 of the semiconductor pellet 101. The pad electrodes 106 are electrically coupled with the electrodes 107 for external connection via conductor patterns not shown in the drawing.

The projected electrodes 103 of the semiconductor pellet 101 are superposed on the pad electrodes 106 of the wiring substrate 104 and coupled therewith by soldering, pressure welding, thermal compression bonding or ultrasonic bonding. Thereby, the projected electrodes 103 and the pad electrodes 106 are electrically connected to each other. Also, the semiconductor pellet 101 and the wiring substrate 104 are bonded by resin 108.

Further, on each of the electrodes 107 for external connection, there is formed a solder ball 109. Each of the solder balls 109 is shaped into a spherical form by melting a solder on the electrode 107 for external connection.

In the semiconductor device 110, only a main portion of the semiconductor pellet 101 is bonded to the wiring substrate 104 by using a minimum necessary amount of resin 108. Thereby, it becomes possible to reduce the external size of the semiconductor device.

As a semiconductor device of this kind, there is proposed a semiconductor device which has still higher mount density. In such semiconductor device, for example, electrodes are further formed on the other of the main surfaces of the semiconductor pellet 101, and another semiconductor pellet is coupled to the electrodes. Alternatively, another semiconductor pellet is mounted on the surface of the wiring substrate 104 on which surface the solder balls 109 are formed.

In the conventional semiconductor device, coefficients of thermal expansion differ largely among the semiconductor pellet 101, the wiring substrate 104 and the resin 108. Therefore, at a high temperature, the wiring substrate 104 warps due to the bimetal effect. Thus, stress concentrates into coupling portions of the electrodes 103 and 106, so that there is a possibility that the projected electrodes 103 peel off from the joined interface portion of the electrodes 103 and the electrodes 106, or the projected electrodes 103 peel off from the semiconductor substrate 102. Therefore, there is a possibility that electrical connection between the semiconductor pellet 101 and the wiring substrate 104 is damaged. In order to avoid such disadvantages, in the resin 108, filler such as silica, alumina and the like which has a thermal expansion coefficient close to that of the semiconductor pellet 101 is dispersed within base resin such as epoxy resin and the like. Thereby, a thermal expansion coefficient of the base resin is lowered, and the effect of difference of the thermal expansion coefficients between the semiconductor pellet 101 and the wiring substrate 104 is reduced.

As an insulating substrate 105 used in the wiring substrate 104, an insulating board is generally known which is fabricated by impregnating resin into a laminated glass fabric body and curing the resin. The laminated glass fabric body are fabricated by stacking a plurality of glass fabrics each of which is made by weaving glass fibers into a cloth.

Also, in each of Japanese patent laid-open publication No. 6-204632 (hereafter referred to as prior art 1) and Japanese patent laid-open publication No. 7-112506 (hereafter referred to as prior art 2), there is disclosed a metal-clad laminated board for a printed circuit board. In the metal-clad laminated board disclosed in these publications, a surface resin layer having a low modulus of elasticity is disposed between a substrate layer of glass fabrics impregnated with epoxy resin and a metal layer formed on a surface of the metal-clad laminated board. Therefore, even when a temperature of the environment in which the metal-clad laminated board is used becomes high and the difference of thermal expansion coefficients between a wiring substrate and surface mounted devices becomes large, the surface resin layer which is in a rubber-like state deforms and a stress caused by the difference of the thermal expansion coefficients between the surface mounted devices and the wiring substrate is mitigated. Therefore, it is possible to prevent a stress from occurring in the solder coupling portions between the surface mounted devices and the wiring substrate.

Here, the inventor of the present invention considered on the case a semiconductor device shown in FIG. 3 is fabricated by using the wiring substrate disclosed in the prior art 1 and prior art 2, and found the following fact.

As a method of coupling the projected electrodes 103 and the pad electrodes 106, it is considered possible to form the projected electrodes 103 by using solder balls and to couple the projected electrodes 103 and the pad electrodes 106 by melting the solder balls. In this case, even if the wiring substrate 104 is heated when coupling the electrodes 103 and 106, there occurs no problem. However, as another method of coupling the electrodes 103 and 106, it is considered possible to heat superposed portions of the projected electrodes 103 and pad electrodes 106 and at the same time to press the projected electrodes 103 onto the pad electrodes 106, thereby thermal compression bonding between the projected electrodes 103 and the pad electrodes 106. In this case, since the surface resin layer of the insulating substrate 105 becomes rubber-like state, the pressed projected electrodes 103 together with the pad electrodes 106 are plunged or pushed into the insulating substrate 105.

The above-mentioned plunging of the projected electrodes 103 into the insulating substrate 105 becomes large especially when the projected electrodes 103 are fabricated in the following manner. That is, a metal ball is formed at the tip portion of a metal wire which is threaded through a capillary. This metal ball is contacted to the surface of the semiconductor substrate 102. Then, the metal ball is pressed and crushed by the lower end of the capillary. Thereafter, the metal wire is cut by pulling it while a portion of the metal wire near the crushed metal ball is left with the crushed metal ball. FIG. 4 shows a conceptual cross sectional view of a projected electrode 103 fabricated in this way. The projected electrode 103 shown in FIG. 4 has different diameters between a base portion 103a and an elongated portion 103b. That is, the diameter of the elongated portion 103b is smaller that of the base portion 103a. Also, the tip portion of the projected electrode 103 has a rotated parabola shape. Therefore, when the projected electrode 103 and the pad electrode 106 are thermal compression bonded, compressive force concentrates in the tip portion of the projected electrode 103. Thus, plunging of the projected electrode 103 into the insulating substrate 105 becomes large.

For example, in the projected electrode 103 fabricated by using a gold wire 25 μm in diameter, the base portion 103a has a diameter of approximately 80 μm, the elongated portion 103b has a diameter of approximately 25 μm, and the height of the projected electrode 103 becomes approximately 75 μm.

When the tip portion of the projected electrode 103 having such shape and size is superposed and pressed onto the pad electrode 106, the elongated portion 103b is compressed in the axial or vertical direction and expands in the radial or horizontal direction. Therefore, the height of the projected electrode 103 becomes lower. In this case, since the tip portion of the elongated portion 103b of the projected electrode 103 is thin, the pressing force by the projected electrode 103 concentrates on a small area of the pad electrode 106.

In the metal-clad laminated board disclosed in the prior art 2, the thickness of the surface resin layer having a low modulus of elasticity is equal to or larger than 20 μm.

When the projected electrode 103 having an initial height of 75 μm is pressed onto the surface of the wiring substrate 104 which is heated and softened, the surface of the pad electrode 106, and the tip portion of the projected electrode 103, is pushed down or plunged by, for example, 5–15 μm from the initial location of the pad electrode 106.

Since the depth to which the projected electrode 103 is pushed down is relatively smaller than the thickness of the surface resin layer, it is generally considered that the depth to which the projected electrode 103 is pushed down becomes constant for every projected electrode 103. However, the inventor of this invention has found that the depth of each dent of the pad electrode 106 does not always become uniform.

The surface of the wiring substrate 104 is flat. However, the glass fabrics within the wiring substrate 104 are woven by glass fiber yarns each made of a plurality of glass fibers. Therefore, although not shown in the drawing, there are minute unevenness at the surface of each glass fabric. For example, in the glass fabric woven by using the glass fiber yarns which are made by bundling several tens through several hundreds glass fibers each having a diameter of 5 μm, unevenness appears whose depth is, for example, 10–30 μm and whose repetition cycle is, for example, 500–1000 μm. It has been found that, by such unevenness at the surface of the glass fabrics, the depth to which each of the projected electrodes 103 is pushed down varies depending on the location on the wiring substrate 104.

FIG. 5 is an enlarged cross sectional view of a portion near the projected electrodes 103, and shows a condition in which the tip portions of the projected electrodes 103 together with the pad electrodes 106 are pushed down into the insulating substrate 105. As shown in FIG. 5, the height or level and/or the slope of the pad electrode 106 differs for each pad electrode 106. Also, the projected electrodes 103 tend to lean differently. As a result, the depth to which the projected electrodes 103 are pushed down vary depending on the location. Thus, condition of coupling between the projected electrodes 103 and the pad electrodes 106 vary depending on the location. The inventor has also found that such phenomenon occurs when the surface resin layer is made of other resin material such as epoxy and the like.

In general, the semiconductor pellet 101 and the wiring substrate 104 are mechanically joined by the resin 108 to strengthen the electric coupling by pressure welding, thermal compression bonding or ultrasonic bonding. Therefore, the above-mentioned uneven coupling condition between the projected electrodes 103 and the pad electrodes 106 does not always affect a quality of the semiconductor device. However, when the semiconductor device is used, for example, in an environment in which temperature varies remarkably, there is a possibility that reliability of the semiconductor device is deteriorated. Also, there is a possibility that an yield of manufacturing a semiconductor device is deteriorated and a cost of manufacturing a semiconductor device becomes high.

SUMMARY OF THE INVENTION

Therefore, it is an object of the present invention to obviate the above-mentioned disadvantages of the conventional semiconductor device and manufacturing method.

It is another object of the present invention to provide a semiconductor device and a method of manufacturing the semiconductor device in which reliable and stable electrical connection can be performed.

It is still another object of the present invention to provide a semiconductor device having high reliability and to provide a method of manufacturing such semiconductor device.

It is still another object of the present invention to provide a semiconductor device and a method of manufacturing the semiconductor device in which depth of cave-in of pad electrodes into pad electrodes of a wiring substrate can be uniformalized within a semiconductor pellet.

It is still another object of the present invention to provide a semiconductor device and a method of manufacturing the semiconductor device in which reliable electrical connection between projected electrodes of a semiconductor pellet and pad electrodes of a wiring substrate can be maintained within a semiconductor pellet.

It is still another object of the present invention to provide a semiconductor device and a method of manufacturing the semiconductor device in which an yield of manufacturing and a cost of manufacturing the semiconductor device can be improved.

According to an aspect of the present invention, there is provided a semiconductor device comprising: a wiring substrate which has a laminated glass fabric body made by laminating a plurality of glass fabrics and impregnating with resin, a resin layer on at least one of surfaces of the laminated glass fabric body, and a plurality of pad electrodes formed on the resin layer, wherein the resin layer has a thickness from 1.5 to 2.5 times the depth of unevenness of the surface of the laminated glass fabric body on which the resin layer exists; and a semiconductor pellet disposed on the wiring substrate and having a plurality of projected electrodes, the projected electrodes being electrically coupled to the pad electrodes by pressing the projected electrodes to the pad electrodes while heating the wiring substrate and/or the semiconductor pellet, tip portions of the projected electrodes together with the pad electrodes plunge into the resin layer.

In this case, it is preferable that the length of each of the projected electrodes before coupling with the pad electrode is larger than the thickness of the resin layer.

It is also preferable that, when the projected electrodes are pressed to the pad electrodes while heating the wiring substrate and/or the semiconductor pellet, the projected electrodes are compressed in a longitudinal direction and expand radially.

It is further preferable that the depth of plunging of each of the projected electrodes is 5–15 µm.

It is advantageous that a pitch of disposition of the projected electrodes is sufficiently smaller than a repetition cycle of the unevenness of the surface of the laminated glass fabric body on the side of the resin layer.

It is also advantageous that the depth of the unevenness of the surface of the laminated glass fabric body on the side of the resin layer is 10–30 µm.

It is further advantageous that the repetition cycle of the unevenness of the surface of the laminated glass fabric body on the side of the resin layer is 500–1000 µm.

It is preferable that material of the resin layer differs from that of the resin impregnated into the laminated glass fabric body.

It is also preferable that the resin layer comprises material having a predetermined low elastic modulus at least at a predetermined high temperature.

It is further preferable that material of the resin layer is the same as that of the resin impregnated into the laminated glass fabric body.

It is advantageous that material of the resin layer is epoxy resin.

According to another aspect of the present invention, there is provided a method of manufacturing a semiconductor device comprising: preparing a wiring substrate which has a laminated glass fabric body made by laminating a plurality of glass fabrics and impregnating with resin, a resin layer on at least one of surfaces of the laminated glass fabric body, and a plurality of pad electrodes formed on the resin layer, wherein the resin layer has a thickness from 1.5 to 2.5 times the depth of unevenness of the surface of the laminated glass fabric body on which the resin layer exists; preparing a semiconductor pellet having a plurality of projected electrodes; and disposing the semiconductor pellet on the wiring substrate and electrically coupling the projected electrodes to the pad electrodes by pressing the projected electrodes to the pad electrodes while heating the wiring substrate and/or the semiconductor pellet.

In this case, it is preferable that the preparing the wiring substrate comprises: laminating a plurality of glass fabrics, impregnating the plurality of glass fabrics with resin and curing the resin, thereby fabricating the laminated glass fabric body; and forming a resin layer on at least one of surfaces of the laminated glass fabric body, such that the resin layer has a thickness from 1.5 to 2.5 times the depth of unevenness of the surface of the laminated glass fabric body on which the resin layer exists.

It is also preferable that the preparing the wiring substrate further comprises forming a plurality of pad electrodes on the resin layer.

It is further preferable that wherein the resin layer comprises material having a predetermined low elastic modulus at least at a predetermined high temperature.

It is advantageous that the preparing the wiring substrate comprises: laminating a plurality of glass fabrics, impregnating the plurality of glass fabrics with resin and curing the resin, thereby fabricating the laminated glass fabric body; wherein the resin layer comprises the same material as that of the resin impregnated into the laminated glass fabric body, and is formed during the fabricating the laminated glass fabric body.

It is also advantageous that, in the electrically coupling the projected electrodes to the pad electrodes, tip portions of the projected electrodes together with the pad electrodes plunge into the resin layer.

It is further advantageous that the depth of plunging of each of the projected electrodes is 5–15 µm.

It is preferable that, in the electrically coupling the projected electrodes to the pad electrodes, the projected electrodes are pressed to the pad electrodes and, thereby, the projected electrodes are compressed in a longitudinal direction and expand radially, and tip portions of the projected electrodes together with the pad electrodes plunge into the resin layer.

It is also preferable that, in the electrically coupling the projected electrodes to the pad electrodes, the projected electrodes and the pad electrodes are coupled by pressure welding, thermal compression bonding and/or ultrasonic bonding.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

The present invention relates to a semiconductor device in which an insulating substrate having laminated glass fabrics or a laminated glass fabric body as a core material, such as a glass epoxy substrate, is used as a wiring substrate on which a semiconductor pellet is mounted. The a laminated glass fabric body of the insulating substrate forming the wiring substrate has unevenness, in the outermost layer, that is, in the surface of the glass fabric on the side opposing the semiconductor pellet. The unevenness has a depth of, for example, 10–30 μm and appears, for example, in a 500–1000 μm cycle. The semiconductor device according to the present invention is characterized in that at least the surface of the laminated glass fabric body on the side opposing to the semiconductor pellet is coated with a resin layer having a thickness of 1.5 through 2.5 times the depth of the unevenness. Further, the end portions of the projected electrodes of the semiconductor pellet contacting the pad electrodes of the wiring substrate are plunged into the pad electrodes.

The end surfaces of the projected electrodes of the semiconductor pellet can be flat or rotated parabola shape. It is more preferable that the length of each of the projected electrodes before pushing onto the pad electrodes is longer than the thickness of the resin layer coating the surface of the laminated glass fabric body on the side opposing the semiconductor pellet. By pressing the projected electrodes onto the pad electrodes, it is possible to compress the projected electrodes in the axial direction and to expand the side portion thereof in radial directions. Thereby, it is possible to plunge the end surfaces of the projected electrodes into the pad electrodes.

In this case, the depth of plunging of the projected electrodes is preferably adjusted to become 5–15 μm, by controlling a heating temperature, a pressing force, and the like of the semiconductor pellet and the wiring substrate.

The present invention shows a remarkable effect when the arrangement space between the projected electrodes formed on the semiconductor pellet is sufficiently smaller than the repetition cycle of the unevenness at the outermost layer of the a laminated glass fabric body.

With reference to the drawings, an embodiment of the present invention will now be explained.

Figure 1:
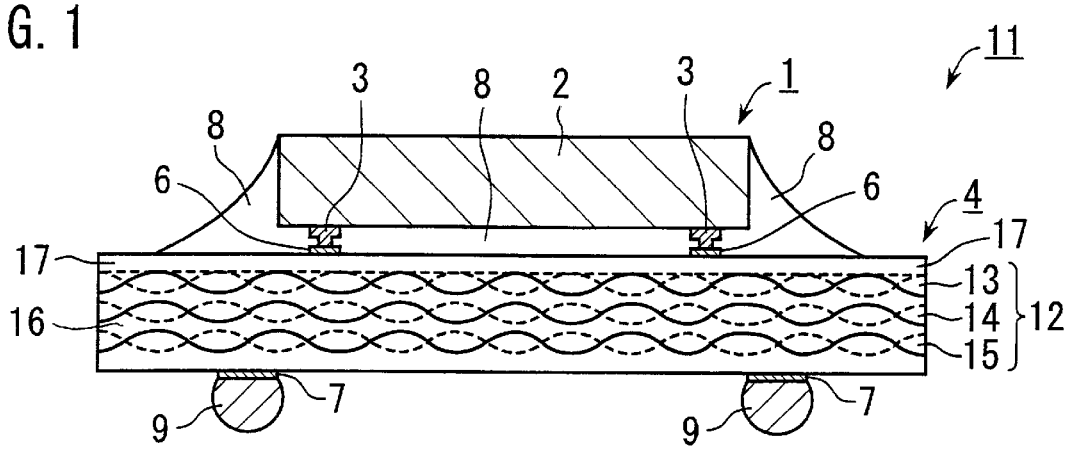
FIG. 1 is a cross sectional view showing a schematic structure of a semiconductor device as an embodiment of the present invention.

FIG. 1 is a side cross sectional view showing a schematic structure of a semiconductor device according to an embodiment of the present invention. The semiconductor device 11 shown in FIG. 1 comprises a wiring substrate 4, and a semiconductor pellet 1 mounted on the wiring substrate 4.

The semiconductor pellet 1 comprises a semiconductor substrate 2, and a number of projected electrodes 3 formed on one of the main surfaces of the semiconductor substrate 2. Although not shown in the drawing, in the semiconductor substrate 2, there are a number of electronic elements formed therein, and these electronic elements are internally coupled with each other to form electronic circuits.

As the wiring substrate 4, an insulating substrate, such as a glass epoxy substrate, is used which is formed by impregnating a laminated glass fabric body with resin. Here, the laminated glass fabric body are made by laminating or stacking a plurality of glass cloths or glass fabrics.

The laminated glass fabric body 12 according to the present embodiment comprises glass fabrics 13, 14 and 15 laminated in order from the side opposing the semiconductor pellet 1. The glass fabric 14 is made by weaving glass fiber bundles, i.e., glass fabric yarns, each comprising many, for example, several tens through several hundreds of glass fibers each of which is, for example, 15 μm in diameter. Each of the glass fabrics 13 and 15 is made by weaving glass fiber bundles, i.e., glass fabric yarns, each comprising many, for example, several tens through several hundreds of glass fibers each of which is, for example, 5 μm in diameter. It should be noted that the number of glass fabrics laminated in the laminated glass fabric body 12 is not limited to 3 (three), but can be any appropriate number. It is also possible to dispose a plurality of, for example, 3 (three), glass fabrics 14 between the glass fabrics 13 and 15. The laminated glass fabric body 12 is impregnated with heat-resistant insulating resin 16 such as epoxy and the like.

At least the surface of the laminated glass fabric body 12 opposing the semiconductor pellet 1 is coated with a resin layer 17.

In the present embodiment, the resin layer 17 is made of resin material whose elastic modulus is low in a high temperature in which the difference of thermal expansion coefficient between the semiconductor pellet 1 and the wiring substrate 4 becomes remarkable. In this case, after impregnating the laminated glass fabric body 12 with the resin 16 and curing the resin 16, it is possible to form the resin layer 17 on the a laminated glass fabric body 12. Material of the resin layer 17 may be or may not be the same as that of the resin 16 impregnated into the laminated glass fabric body 12. For example, when both the resin 16 and the resin layer 17 are made of epoxy resin, it is possible to form the resin layer 17 having a predetermined thickness and made of the epoxy resin on the laminated glass fabric body 12, during the process of impregnating the laminated glass fabric body 12 with epoxy resin and of curing the epoxy resin.

Also, on one of the main surfaces of the wiring substrate 4, that is, on the resin layer 17, there are formed a plurality of pad electrodes 6. The pad electrodes 6 are formed at locations corresponding to the projected electrodes 3 of the semiconductor pellet 1. On the other main surface of the wiring substrate 4, there are formed electrodes 7 for external connection. Also, the pad electrodes 6 and the electrodes 7 for external connection are electrically coupled with each other via conductor patterns, which are formed within and/or on the wiring substrate 4 and which are not shown in the drawing, to form a circuit or circuits.

The projected electrodes 3 of the semiconductor pellet 1 and the pad electrodes 6 of the wiring substrate 4 are electrically coupled with each other. The semiconductor pellet 1 and the wiring substrate 4 are joined via resin 8. In the semiconductor device 11, only a main portion or a part of the semiconductor pellet 1 is bonded onto the wiring substrate 4 via minimum necessary amount of resin 8. Therefore, it is possible to reduce an outer size of the semiconductor device 11. Also, solder balls 9 are formed on the electrodes 7 for external connection. Each of the solder balls 9 is formed into a spherical shape by melting a solder material on the electrodes 7 for external connection.

In the semiconductor device according to the present embodiment, coupling between the projected electrodes 3 of the semiconductor pellet 1 and the pad electrodes 6 of the wiring substrate 4 is done, for example, as follows. First, the semiconductor pellet 1 and the wiring substrate 4 are opposed, and the projected electrodes 3 of the semiconductor pellet 1 are opposed on the pad electrodes 6 of the wiring substrate 4. Then, the projected electrodes 3 are compressed onto the pad electrodes 6, and projected electrodes 3 and the pad electrodes 6 are electrically coupled, by pressure welding, thermal compression bonding, ultrasonic bonding, or the like. At the same time, or thereafter, the semiconductor pellet 1 and the wiring substrate 4 are joined by the resin 8 for bonding.

The resin 8 is made by dispersing filler material such as silica, alumina and the like within base resin material such as epoxy and the like, in a manner similar to the resin 108 of the conventional semiconductor device 1. Detailed explanation is omitted here.

Figure 2:
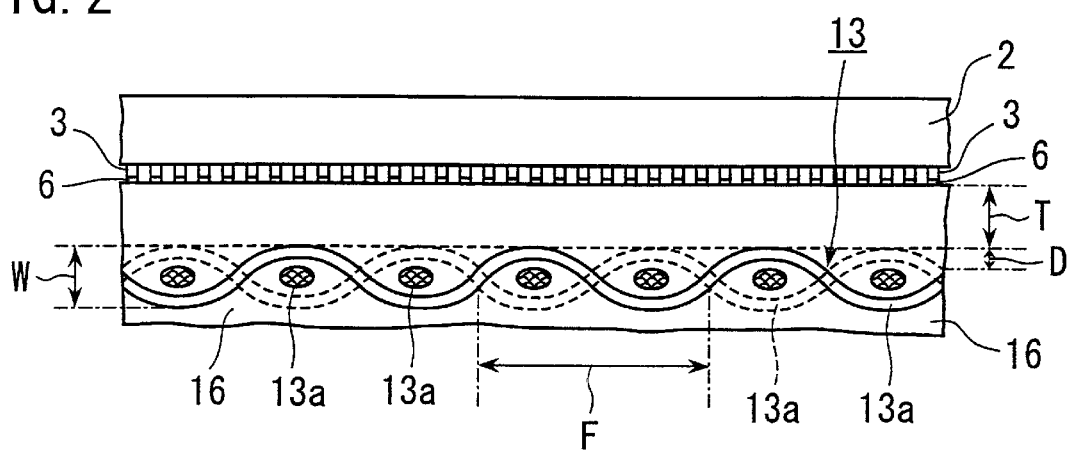
FIG. 2 is a partial enlarged cross sectional view showing a structure of a main portion the semiconductor device of FIG. 1.

FIG. 2 is a partial enlarged view showing conceptually a main portion of the semiconductor device 11 according to the present embodiment of FIG. 1. FIG. 2 shows a portion near the area in which the wiring substrate 4 and the semiconductor pellet 1 oppose to each other, in detail.

As shown in FIG. 2, the glass fabric 13 is made by weaving glass fiber bundles 13a, i.e., glass fabric yarns 13a, each comprising many glass fibers. In FIG. 2, the glass fiber bundles 13a, while rolling, extend along lateral direction in the drawing and vertical direction to the sheet of the drawing. A diameter of each of the glass fiber bundles 13a depends on a diameter of each glass fiber bundled and/or number of the glass fibers bundled. The diameter of each of the glass fiber bundles can be any appropriate value depending on the necessity.

Here, as can be seen from FIG. 2, it should be noted that the surface of the glass fabric 13 made by weaving the glass fiber bundles 13a becomes uneven. A depth D, a repetition cycle F and an amplitude W of the unevenness of the surface of the glass fabric 13 depend on the diameter of each of the glass fiber bundles 13a. Therefore, the depth D, the repetition cycle F and the amplitude W of the unevenness of the surface of the glass fabric 13 depend on the diameter and/or the number of the glass fibers constituting the glass fiber bundles 13a. For example, assume that the glass fabric 13 is woven by the glass fiber bundles 13a each of which is made by bundling several tens through several hundreds of the glass fibers each 5 μm in diameter. In such case, the unevenness on the surface of the glass fabric 13 has the depth D of 10–30 μm, the cycle F of 500–1000 μm, and the amplitude W of 60 μm. When the glass fiber used has a diameter within a range between 3–20 μm, each range of the depth D, the repetition cycle F and the amplitude W includes a part of the above-mentioned range (D=10–30 μm, F=500–1000 μm, W=60 μm) in case the diameter of the glass fiber is 5 μm. That is, when the glass fibers 3 μm in diameter are used, the depth D of the surface unevenness of the glass fiber 13 is in a range from a value smaller than 10 μm to a value between 10 and 30 μm. Also, when the glass fibers 20 μm in diameter are used, the depth D of the surface unevenness of the glass fiber 13 is in a range from a value between 10 and 30 μm to a value larger than 30 μm.

With respect to the glass fabric 14 disposed in the middle portion of the laminated glass fabric body 12, depth, cycle and amplitude of unevenness are all larger than those of each of the glass fabrics 13 and 15. However, the unevenness of the glass fabric 14 gives little influence on the surface of the glass fiber bundles 12.

As mentioned above, at least the surface of the laminated glass fabric body 12 opposing the semiconductor pellet 1 is covered by the resin layer 17. The present embodiment is characterized in that the thickness T of the resin layer 17 is 1.5 through 2.5 times the depth D of the unevenness of the surface of the glass fabric 13. For example, when the resin layer 17 is formed in a manufacturing process of the wiring substrate 4, the formed thickness of the resin layer 17 is controlled depending on the depth D of the unevenness of the glass fabric 13. It is preferable that the thickness of the resin layer 17 is, for example, 20–50 μm.

By coating the a laminated glass fabric body 12 with the the resin layer 17 having the thickness T which is 1.5 through 2.5 times the depth D of the unevenness of the surface of the glass fabric 13, it is possible to avoid an influence caused by the unevenness of the glass fabric 13.

When the thickness T of the resin layer 17 is smaller than 1.5 times the depth D of the unevenness of the surface of the glass fabric 13, an influence by the unevenness of the surface of the glass fabric 13 appears on the surface of the resin layer 17. On the other hand, when the thickness T of the resin layer 17 is larger than 2.5 times the depth D of the unevenness of the surface of the glass fabric 13, the wiring substrate 4 becomes too thick. In such case, downsizing and thinning down of a semiconductor device are prohibited.

Figure 4:
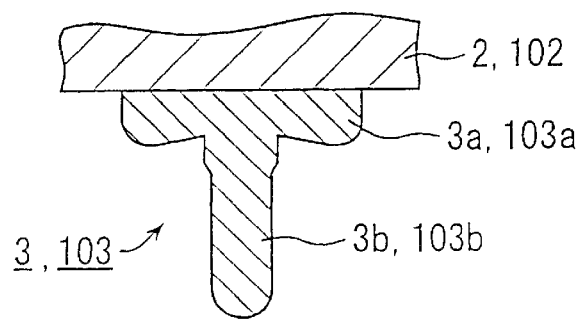
FIG. 4 is a partial enlarged cross sectional view showing a detailed structure of a projected electrode used in the semiconductor devices of FIG. 1 and FIG. 3.
Figure 5:
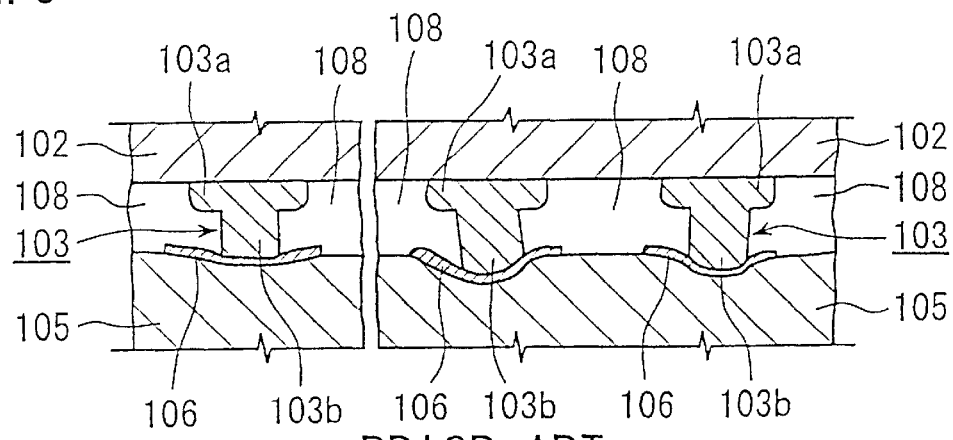
FIG. 5 is a partial enlarged cross sectional view showing coupling portions of the semiconductor device of FIG. 3 in detail.

Now, a detailed explanation will be made on electrical coupling between the projected electrodes 3 of the wiring substrate 4 and the pad electrodes 6 of the semiconductor pellet 1. On the surface of the wiring substrate 4 on which the pad electrodes 6 are formed, the semiconductor pellet 1 is mounted. On the surface of the semiconductor pellet 1 on the side joined onto the wiring substrate 4, there are disposed, for example, 200 projected electrodes 3, i.e., 50 projected electrodes 3 along each side. Each of the projected electrodes 3 of the semiconductor pellet 1 has a structure similar to that of the projected electrodes 103 described before with reference to FIG. 4, and detailed explanation thereof is omitted here. As an example, in the projected electrode 3, a portion having a large diameter, i.e., a base portion 3a has a diameter of approximately 80 μm, a portion having a small diameter, i.e., a middle portion 3b has a diameter of approximately 25 μm, and the height of the projected electrode 3 is approximately 75 μm. The tip portion of the middle portion 3b of the projected electrode 3 has a rotated parabola shape.

Each of the pad electrodes 6 has a square shape which is 100 μm square, that is, 100 μm×100 μm in sizes. The pad electrodes 6 are disposed on the wiring electrode 4, for example, every 200 μm, that is, at intervals of 100 μm. Therefore, in such case, the projected electrodes 3 are also disposed, for example, every 200 μm.

The projected electrodes 3 are contacted and pressed onto the pad electrodes 6. In this case, in each of the projected electrodes 3, the tip portion is compressed and crushed in the axial direction and the portion 3b having a small diameter expands in radial directions.

Then, the projected electrodes 3 and the pad electrodes 6 are coupled by means of pressure welding, thermal compression bonding, ultrasonic bonding or the like. In order to realize good electrical coupling between the projected electrodes 3 and the pad electrodes 6, the wiring substrate 4 is heated. Thereby, the surface portion of the wiring substrate 4, that is, the resin layer 17, softens with elasticity.

Therefore, when the projected electrodes 3 are pressed onto the wiring substrate 4 which is softened, the tip portions of the projected electrodes 3 cave in the pad electrodes 6, and the tip portions of the projected electrodes 3 together with the pad electrodes 6 plunge into the resin layer 17. In this case, it is preferable that a pressing force per one projected electrode 3 is controlled in a range between 0.1 and 0.6N depending on the softening condition of the wiring substrate 4 such that the depth of plunging of the projected electrode 3 becomes 5–15 $\mu$m. The total length of each of the projected electrodes 3 is compressed from approximately 75 $\mu$m to 40–60 $\mu$m. The total length of the projected electrode 3 before compression, that is, 75 $\mu$m in this embodiment, is preferably larger than the thickness of the resin layer 17.

The depth of plunging of each projected electrode 3 can be obtained from the level of the tip portion of the projected electrode 3 after plunging into the pad electrode 6, by using the level of the pad electrode 6 before plunging of the projected electrode 3 thereinto. The plunging depth of each of the projected electrodes 3 depends on the temperature of the wiring substrate 4 which is heated when coupling the projected electrodes 3 and the pad electrodes 6. When only the projected electrodes 3, that is, semiconductor pellet 1, are heated without heating the wiring substrate 4, the depth of plunging of the projected electrodes 3 can be set, for example, at 2 $\mu$m. However, in such case, coupling between the projected electrodes 3 and the pad electrodes 6 becomes unstable.

It is preferable that the depth of plunging of the projected electrodes 3 is equal to or smaller than 15 $\mu$m. This is because, when the depth of plunging is larger than 15 $\mu$m, there is a possibility that the projected electrodes 3 and the pad electrodes 3 become close to the uneven portion of the surface of the glass fabric 13 within the resin layer 17 and an influence of the unevenness becomes large.

In this way, the projected electrodes 3 together with the pad electrodes 6 plunge into the resin layer 17. In this case, there exist hard and wavy glass fibers disposed under the resin layer 17. Repelling force is exerted onto the pad electrodes 6 by the resin layer 17 from the wavy glass fibers as a base.

The direction and/or strength of the repelling force differs for each pad electrode 6 depending on the slope and/or level of each portion of the uneven surface of the glass fabric 13. That is, the direction and/or strength of the repelling force exerted on each pad electrode 6 varies depending on where on the uneven surface of the glass fabric 13 the pad electrode 6 exists. This causes variation of the slope and/or level of each pad electrode 6 plunged into the resin layer 17. This also causes variation of the lean of each projected electrode 6. However, the semiconductor device according to the present invention is characterized in that the thickness T of the resin layer 17 is set to 1.5 through 2.5 times the depth D of unevenness of the glass fabric 13. Therefore, pressing force exerted onto the glass fabric 13 is reduced, and repelling force exerted back from the glass fabric 13 to the pad electrodes 6 is also reduced. As a result, variation or dispersion of levels and slopes of the pad electrodes 6 plunged into the resin layer 17 are mitigated. Also, it is possible to suppress variation of the depths of plunging of the projected electrodes 3 in one semiconductor pellet 1.

Further, each projected electrode 3 does not lean. Therefore, in the semiconductor device 11 according to the present embodiment, coupling condition between each projected electrode 3 and each pad electrode 6 is unformalized and stabilized, without suffering an influence by the unevenness of the surface of the glass fabric 13.

Thus, it is possible to improve reliability of a semiconductor device. Also, it is possible to improve a manufacturing yield of a semiconductor device, and thereby to decrease manufacturing cost of the semiconductor device. Further, even if expansion and contraction of various portions of a semiconductor device are repeated due to the repetition of operation and stoppage of the semiconductor device, it is possible to maintain electric coupling between the projected electrodes 3 and the pad electrodes 6 in good condition. The effect obtained by the present invention becomes more remarkable when the pitch of the projected electrodes 3 formed in the semiconductor pellet 1 is sufficiently smaller than the repetition cycle F of the unevenness of the glass fabric 13.

Such effect of the present invention can be realized regardless of resin material of the resin layer 17. That is, the above-mentioned effect can be obtained not only when the resin layer 17 is made of resin material having a low elastic modulus, but also when the resin layer 17 is made of other resin material, for example, epoxy resin and the like. For example, when the projected electrodes 3 are pressed onto the pad electrodes 6 while heating the wiring substrate 4 to couple the projected electrodes 3 and the pad electrodes 6, the projected electrodes 3 together with the pad electrodes 6 plunge into the resin layer 17 made of epoxy resin. According to the present invention, the thickness of the resin layer 17 made of epoxy resin is within 1.5–2.5 times the depth D of the unevenness of the surface of the glass fabric 13 as mentioned in the above-mentioned embodiment. Thereby, it is possible to suppress variation of the depths of plunging of the projected electrodes 3. Further, each projected electrode 3 does not lean. Therefore, coupling condition between each projected electrode 3 and each pad electrode 6 is unformalized and stabilized, without suffering an influence by the unevenness of the surface of the glass fabric 13. Therefore, it is possible to improve reliability of a semiconductor device.

In case the semiconductor device 11 is in operation, the semiconductor pellet 1 and the like heat up. Therefore, it is preferable that the semiconductor device 11 is cooled by a cooling device, a heat sink and the like to avoid heating up of the semiconductor device 11. However, when the resin layer 17 is made of resin material having a low elastic modulus or having an elastic modulus that decreases at least in a high temperature in which the difference of heat expansion coefficients between the semiconductor pellet 1 and the wiring substrate 4 becomes remarkable, it may be unnecessary to cool the semiconductor device 11 by a cooling apparatus and the like. This is because when the temperature of the surface portion of the wiring substrate 4 becomes high due to the heat of the semiconductor pellet 1, the resin layer 17 under the pad electrodes 6 softens and shows rubber-like property. Therefore, the pad electrodes 6 on the resin layer 17 showing rubber-like property can follow the locations of the projected electrodes 3 of the semiconductor pellet 1 having a thermal expansion coefficient smaller than that of the wiring substrate 4. Thus, stress is not concentrated on each of the coupling portions between the projected electrodes 3 and the pad electrodes 6, and it is possible to always maintain good electrical connection between the projected electrodes 3 and the pad electrodes 6.

In this case, the laminated glass fabric body 12 function as core material of the wiring substrate 4, and thereby increase the strength of the wiring substrate 4 and keep flatness thererof.

Figure 3:
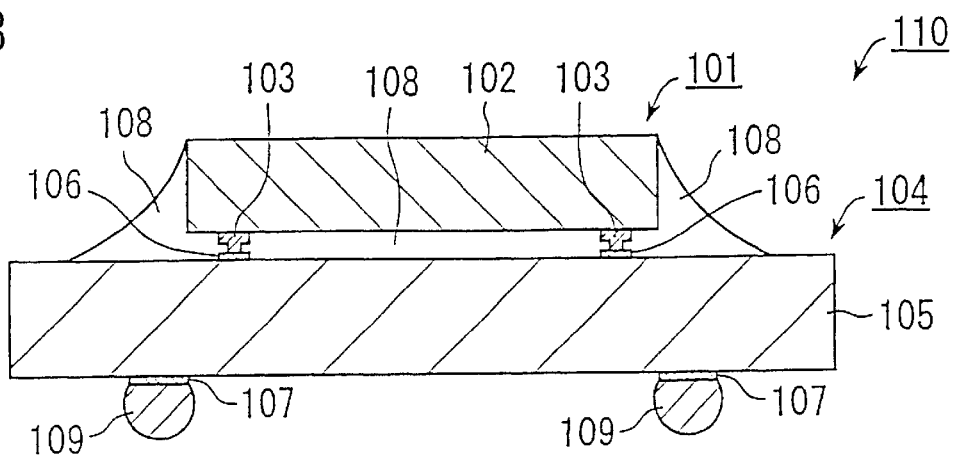
FIG. 3 is a cross sectional view showing a schematic structure of a conventional semiconductor device.

The present invention is not limited to the above-mentioned embodiment. For example, each of the projected electrodes 3 is not limited to that shown in FIG. 3 which is made by using a metal wire and which has portions of different diameters. As an example, it is possible to make projected electrodes 3 by using a plating method such as electroplating, nonelectrolytic plating and the like. In such case, it is possible that each of the projected electrodes 3 has, for example, a cylindrical shape or a polygonal cylindrical shape. The tip portion of each of the projected electrodes 3 may be flat or curved shape.

In the above-mentioned embodiment, the glass fabric 14 is disposed in the central portion of the laminated glass fabric body 12 of the wiring substrate 4. However, in place of the glass fabric 14, it is possible to use a non-woven fabric made of a material having heat resistance, for example, polyimide. It is intended that the laminated glass fabric body according to the present invention also includes the structure in which the non-woven fabric is disposed between the glass fabrics.

In the above-mentioned embodiment, one semiconductor pellet 1 is mounted on one of the surfaces of the wiring substrate 4. However, it is also possible to mount a plurality of semiconductor pellets 1 on one surface of the wiring substrate 4. Further, the present invention is applicable to a semiconductor device in which semiconductor pellets 1 are mounted on both surfaces of the wiring substrate 4.

As mentioned above, according to the present invention, it is possible to avoid variation or dispersion of the level and slope of the pad electrodes plunged into the resin layer. Also, it is possible to suppress variation of depth of the projected electrodes plunged into the resin layer along with the pad electrodes. Further, it is possible to avoid leaning of the projected electrodes. Therefore, coupling condition between each projected electrode and each pad electrode is unformalized and stabilized, without suffering an influence by the unevenness of the surface of the glass fabric. Further, even if expansion and contraction of a semiconductor device are repeated due to the repetition of operation and stoppage of the semiconductor device, it is possible to maintain electric coupling between the projected electrodes and the pad electrodes in good condition. Therefore, it is possible to provide a semiconductor device having high reliability and a method of manufacturing the same.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:
    a wiring substrate which has a laminated glass fabric body made by laminating a plurality of glass fabrics and impregnating with resin, a covering resin layer on at least substantially all of one of surfaces of said laminated glass fabric body, and a plurality of pad electrodes formed on said resin layer, wherein said covering resin layer has a thickness from 1.5 to 2.5 times the depth of unevenness of the surface of said laminated glass fabric body on which said covering resin layer exists; and
    a semiconductor pellet disposed on said wiring substrate and having a plurality of projected electrodes, said projected electrodes being electrically coupled to said pad electrodes by pressing said projected electrodes to said pad electrodes while heating said wiring substrate and/or said semiconductor pellet, tip portions of said projected electrodes together with said pad electrodes plunge into said resin layer.

2. A semiconductor device as set forth in claim 1, wherein the length of each of said projected electrodes before coupling with said pad electrode is larger than the thickness of said resin layer.

3. A semiconductor device as set forth in claim 1, wherein, when said projected electrodes are pressed to said pad electrodes while heating said wiring substrate and/or said semiconductor pellet, said projected electrodes are compressed in a longitudinal direction and expand radially.

4. A semiconductor device as set forth in claim 1, wherein the depth of plunging of each of said projected electrodes is 5–15 $\mu$m.

5. A semiconductor device comprising:
    a wiring substrate which has a laminated glass fabric body made by laminating a plurality of glass fabrics and impregnating with resin, a resin layer on at least one of surfaces of said laminated glass fabric body, and a plurality of pad electrodes formed on said resin layer, wherein said resin layer has a thickness from 1.5 to 2.5 times the depth of unevenness of the surface of said laminated glass fabric body on which said resin layer exists; and
    a semiconductor pellet disposed on said wiring substrate and having a plurality of projected electrodes, said projected electrodes being electrically coupled to said pad electrodes by pressing said projected electrodes to said pad electrodes while heating said wiring substrate and/or said semiconductor pellet, tip portions of said projected electrodes together with said pad electrodes plunge into said resin layer;
    wherein a pitch of disposition of said projected electrodes is sufficiently smaller than a repetition cycle of said unevenness of the surface of said laminated glass fabric body on the side of said resin layer.

6. A semiconductor device as set forth in claim 1, wherein the depth of said unevenness of the surface of said laminated glass fabric body on the side of said resin layer is 10–30 $\mu$m.

7. A semiconductor device as set forth in claim 1, wherein the repetition cycle of said unevenness of the surface of said laminated glass fabric body on the side of said resin layer is 500–1000 $\mu$m.

8. A semiconductor device as set forth in claim 1, wherein material of said resin layer differs from that of said resin impregnated into said laminated glass fabric body.

9. A semiconductor device as set forth in claim 1, wherein said resin layer comprises material having a predetermined low elastic modulus at least at a predetermined high temperature.

10. A semiconductor device comprising:
    a wiring substrate which has a laminated glass fabric body made by laminating a plurality of glass fabrics and impregnating with resin, a resin layer on at least one of surfaces of said laminated glass fabric body, and a plurality of pad electrodes formed on said resin layer, wherein said resin layer has a thickness from 1.5 to 2.5 times the depth of unevenness of the surface of said laminated glass fabric body on which said resin layer exists; and a semiconductor pellet disposed on said wiring substrate and having a plurality of projected electrodes, said projected electrodes being electrically coupled to said pad electrodes by pressing said projected electrodes to said pad electrodes while heating said wiring substrate and/or said semiconductor pellet, tip portions of said projected electrodes together with said pad electrodes plunge into said resin layer;

wherein material of said resin layer is the same as that of said resin impregnated into said laminated glass fabric body.

11. A semiconductor device as set forth in claim 1, wherein material of said resin layer is epoxy resin.

\* \* \* \* \*